US006937048B2

(12) United States Patent
Eichin et al.

(10) Patent No.: US 6,937,048 B2
(45) Date of Patent: Aug. 30, 2005

(54) METHOD FOR TESTING AN INTEGRATED CIRCUIT WITH AN EXTERNAL POTENTIAL APPLIED TO A SIGNAL OUTPUT PIN

(75) Inventors: Matthias Eichin, Heilbronn (DE); Alexander Kurz, Schwaebisch Hall (DE)

(73) Assignees: Atmel Germany GmbH, Heilbronn (DE); Vishay Semiconductor GmbH, Heilbronn (DE)

( * ) Notice: Subject to any disclaimer, the term of this patent is extended or adjusted under 35 U.S.C. 154(b) by 96 days.

(21) Appl. No.: 10/021,746

(22) Filed: Dec. 11, 2001

(65) Prior Publication Data

US 2002/0079916 A1 Jun. 27, 2002

(30) Foreign Application Priority Data

Dec. 22, 2000 (DE) .......................... 100 64 478

(51) Int. Cl.⁷ ........................ G01R 31/26; G01R 1/04
(52) U.S. Cl. ..................... 324/765; 324/158.1
(58) Field of Search ................. 324/765, 763, 324/158.1; 714/718, 733–734, 726, 727

(56) References Cited

U.S. PATENT DOCUMENTS

| | | | |
|---|---|---|---|
| 4,860,259 A | | 8/1989 | Tobita |
| 5,212,442 A | * | 5/1993 | O'Toole et al. ............ 324/73.1 |
| 5,402,063 A | | 3/1995 | Kim |
| 5,847,561 A | * | 12/1998 | Whetsel .................... 324/158.1 |
| 5,933,378 A | * | 8/1999 | Gans et al. ............... 324/158.1 |
| 6,037,792 A | * | 3/2000 | McClure ..................... 324/760 |
| 6,046,947 A | * | 4/2000 | Chai et al. .................. 365/201 |
| 6,081,464 A | * | 6/2000 | Marr .......................... 365/201 |
| 6,160,413 A | * | 12/2000 | Habersetzer et al. ........ 324/763 |
| 6,255,838 B1 | * | 7/2001 | Habersetzer et al. ........ 324/763 |
| 6,265,889 B1 | * | 7/2001 | Tomita et al. ............... 324/765 |
| 6,313,655 B1 | | 11/2001 | Krause |
| 6,388,926 B1 | * | 5/2002 | Gans et al. ............... 324/158.1 |
| 6,570,400 B2 | * | 5/2003 | Habersetzer et al. ........ 324/763 |
| 6,646,459 B2 | * | 11/2003 | Habersetzer et al. ........ 324/763 |

FOREIGN PATENT DOCUMENTS

| | | |
|---|---|---|
| DE | 3639169 | 7/1987 |
| DE | 4223127 | 1/1993 |
| DE | 19735406 | 2/1999 |
| EP | 0535776 | 4/1993 |

OTHER PUBLICATIONS

"IR Receiver ASIC", Temic Semiconductors, T2521B, Rev. A1, Dec. 10, 1999, pp. 1 to 7.

IR Receiver for Data Communication ($f_{carrier}$ = 20 to 60 kHz), Temic Semiconductors, U2548B, Rev. A1, Feb. 26, 1997, pp. 1 to 8.

* cited by examiner

*Primary Examiner*—Jermele Hollington
(74) *Attorney, Agent, or Firm*—W. F. Fasse; W. G. Fasse

(57) ABSTRACT

In previously known methods for testing internal signals of an integrated circuit, additional output pins were required which, in general, were linked to additional measuring pads within the integrated circuit.

In the new method, the circuit functions are tested by using the output pins at which the output signal is present during normal operation of the integrated circuit. By means of a simple, external connection, with which a defined voltage value is set at the signal output, the integrated circuit is switched by means of an integrated control unit into a test mode in which it applies selected signals, which are to be tested, at the signal output. There is no need for additional internal measuring pads or additional output pins.

16 Claims, 3 Drawing Sheets

(NEW FIG. TO BE ADDED TO THE APPLICATION)

METHOD FOR TESTING AN INTEGRATED CIRCUIT WITH AN EXTERNAL POTENTIAL APPLIED TO A SIGNAL OUTPUT PIN

BACKGROUND

1. Field of the Invention

The present invention relates to a method for testing an integrated circuit and a circuit arrangement for performing this method.

2. Description of the Related Technology

In the case of integrated circuits (ICs), electrical measurements are made after the manufacturing process in order to test the circuits. The high degree of complexity makes it necessary to measure not only the output signals of the entire circuit but also the signals of individual internal functional groups of a circuit. In the development phase, additional internal contact surfaces, so-called measuring pads which are assigned to the individual circuit blocks, are integrated for this purpose. Function checks can be performed at these measuring pads provided that the integrated circuits are not yet enclosed in a casing. In the case of the finished integrated circuits, some of the measuring pads are linked to external bond pads for the purpose of checking the correct function, and also in order to measure the signals to be tested at additional output pins even in the assembled state. Both the additional measuring pads within the integrated circuits as well as the additional pins on the finished IC require an additional area which, in the case of miniaturization, increases as a percentage of the whole.

Examples for the previous method are provided by known integrated circuits (IC), such as the U2548 and U2521 from the ATMEL Germany GmbH company, for example. In these cases, a part of the measuring pads present within the integrated circuit was linked to additional measuring pads in order to test signals of individual circuit functions.

Another method working according to the previous state-of-the-art is known from the publication EP 0535776 B1. A test mode is activated at an additional input pin by an available signal and by means of an internal logic in order to thus apply selected signals, which are to be tested, of individual circuit units of the integrated circuit at the additional input pins of the integrated circuit.

The disadvantage of the known methods according to the state of the art is that the areas needed for the function checks occupy a substantial part of the total area of the circuit, particularly in the case of small, but highly integrated circuits, in which the area is divided between the measuring pads within the circuit and the additional pins which are needed for the external measurement of the signals. Because of the large part of the total chip area, this gives rise to a substantial proportion of the total cost of a circuit. This has a negative effect on profitability, particularly in the case of small circuits which are manufactured in large numbers.

SUMMARY OF THE INVENTION

The object of the present invention is to provide a method by which the internal signals of an integrated circuit are made available for external function checks with the use of already existing pins. A further object of the invention is to specify a circuit arrangement for implementing the method which can be easily and economically manufactured.

The above objects have been achieved according to the invention in a circuit arrangement and a method of operating it, as defined in the claims.

Accordingly, the essence of the invention lies in switching the signals generated by a circuit unit within an integrated circuit, which are not measurable at the outputs in the normal operating mode, as test signals to the existing signal outputs for function checks. To do this, a defined potential value is applied to at least one signal output of the integrated circuit while the supply voltage is available, and the integrated circuit is thus switched into a test mode. A test signal generated by a circuit unit of the integrated circuit is thus applied at the signal output. In order to be able to achieve a reliable switchover into the test mode, it is necessary for the potential value applied at the signal output to be different from the value of the output voltage available at the signal output in normal operation of the integrated circuit. It is particularly advantageous if the potential value is applied or set at the signal output by means of a passive component, for example by a resistor.

In comparison to the previous state of the art, it is advantageous that internal measuring pads do not have to be provided for the individual circuit elements of the circuit unit during the circuit design, and chip area is thus saved. Moreover, no additional pins or thus bond pads are needed for switching the integrated circuit into a test mode or for measuring the test signals. Particularly in the case of integrated circuits with signal outputs which are designed as "open collectors" with "pull up" resistors, a potential value, with which the integrated circuit can be switched into a test mode, can be set in a very inexpensive manner by means of a resistor. Moreover, it is irrelevant to the new method whether or not an input signal is available at a signal input of the integrated circuit. In particular, the output signals of circuit elements of the integrated circuit which is to be tested, which has an oscillator stage for example, can be made available as test signals at the signal output. Moreover, it is also possible to measure the test signal if there is an input signal available at the signal input of the integrated circuit, in order to check, in particular, the signal processing circuit elements of the circuit unit.

In a development of the method, a plurality of potential values can also be applied at the signal output. By assigning each of the potential values to a different test signal, different test signals can be measured one after the other at a single signal output. In the case of integrated circuits which have only a single signal output, this enables different test signals to be analyzed one after the other at a single signal output with low circuit complexity.

In a development of the method, it is advantageous to test the values of the potential values applied at the signal output for conformity with a reference value by means of a control unit during a defined time window before switching the integrated circuit into the test mode, and to switch the integrated circuit into the test mode in a second time window provided that the potential value available at the signal output corresponds to the defined reference value. In so doing, it is advantageous if the potential value set at the signal output remains constant over time and the test signal represents an alternating voltage. The direct voltage components can thus be easily separated with an external measurement arrangement. In comparison to the previous state of the art, an integrated circuit can be switched into a test mode by means of a single resistor in a particularly simple and inexpensive manner with the method according to the invention.

In the case of a plurality of signal outputs, it is possible in a development of the method for the control unit to test the potential value set at a first signal output and apply the test signal at another, e.g. second, signal output. The advantages of this are that there is no superimposition with the set direct voltage value and that a direct voltage offset of the test signal can be measured.

In another development of the method, the control unit performs a Boolean logic operation with the potential value set at the signal output and a signal of a circuit component of the circuit unit. An AND logic operation with the negative signal value enables, for example, the integrated circuit to be prevented from being switched into a test mode by a potential available at the signal output. For this purpose, it is advantageous if the logic operation is performed with a control voltage from an output stage of the integrated circuit. This embodiment of the method according to the invention enables the test signal in the test mode to be prevented from being superimposed at the signal output on the output signals available in normal operation, that is if input signals are available for example, in a particularly reliable manner.

Investigations by the applicant have shown that it is advantageous if different test signals are selected as a function of the voltage values set at the signal output, in that, for example, specific parts of the circuit are activated or deactivated by the control unit when there are defined potential values within the circuit unit. In this manner, defined signal shapes can be generated in the case of the test signals with or without an available input signal.

In a further development of the method according to the invention, the integrated circuit is switched into the test mode if the potential value available at the signal output of the integrated circuit lies within a voltage interval of a voltage window discriminator. In so doing, it is advantageous if the signal heights of the test signals, that is their amplitudes and their direct voltage offsets, are set by means of signal amplifiers so that the direct voltage offset of the respective test signal corresponds to the potential value Bet at the signal output, and the maximum amplitude of the test signal lies within the interval defined by the respective window of the discriminator. Crosstalk between adjacent windows of the discriminators can be prevented in this way provided that a plurality of window discriminators are used. Furthermore, the direct voltage value at the signal output is little changed.

The present, new circuit arrangement can be used in an advantageous manner for implementing the method according to the invention. An advantage of the integration of a control unit and at least one switching element according to the second-mentioned object of the present invention is that all internal measuring pads may be eliminated while incurring little additional circuit complexity. Another advantage is that a single resistor, which is connected externally to the signal output, is sufficient to switch the integrated circuit into a test mode if the supply voltage is available.

BRIEF DESCRIPTION OF THE FIGURES

The method according to the invention is described in the following by means of an embodiment in conjunction with the drawings. They show.

DESCRIPTION OF THE PREFERRED EMBODIMENTS

Figure 1:
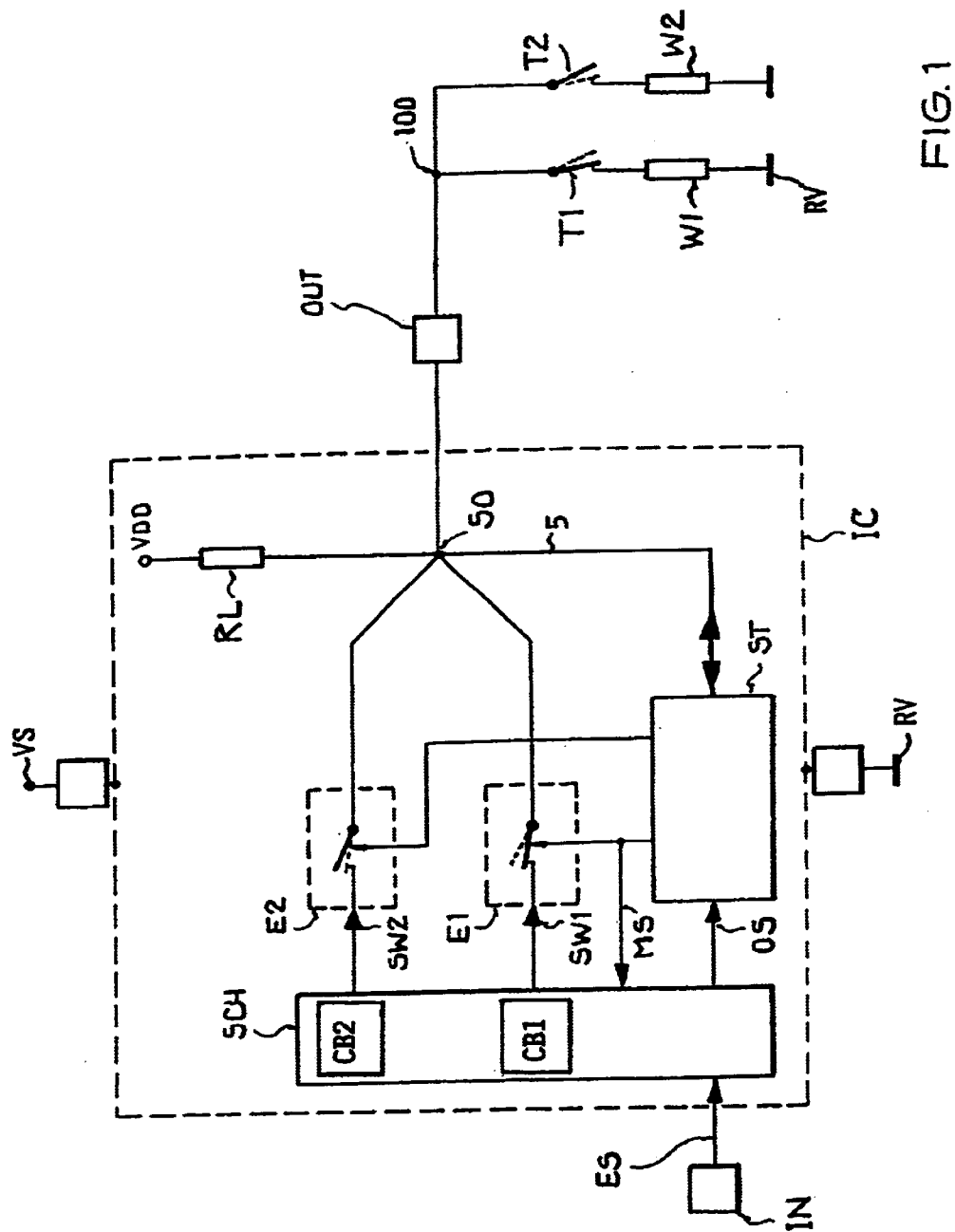
FIG. 1 A first circuit arrangement for implementing the method according to the invention, FIG. 2 A second circuit arrangement for implementing the method according to the invention, and FIG. 3 A third circuit arrangement with plural output pins.

The object of the integrated circuit IC shown in FIG. 1 is to apply the output signals from a circuit unit as test signals to a signal output of the integrated circuit provided that, at the signal output, an externally applied potential value, which can be set by means of an external resistor for example, corresponds to a defined reference value. The integrated circuit IC has an input pin IN and an output pin OUT for this purpose. The output pin OUT is externally linked to a reference potential RV via a node 100 which is connected to a resistor W1 by means of a switch T1 or to a resistor W2 by means of a switch T2. Furthermore, the integrated circuit has another pin at which a supply voltage VS is available and a pin which is linked to the reference potential RV.

There are two functional units within the integrated circuit IC. The first functional unit contains the circuit functions needed for normal operation of the integrated circuit, which are represented, with the exception of a load element RL connected as a "pull up" between the voltage VDD and a node 50, by a circuit unit SCH, the second functional unit comprises the test mode detection which consists of a control unit ST and a first and a second voltage-controlled switching element E1 and E2. The circuit unit or element SCH has a first input which is linked to the signal input IN of the integrated circuit IC, and a second input at which a signal MS is available, and a first output line, which is linked to the control unit ST, a second output line which is linked to the switching element E1, at which a signal SW1 which is to be tested is available, and a third output line which is linked to the switching element E2, at which a signal SW2 which is to be tested is available. The circuit unit includes plural internal circuit blocks CB1 and CB2, which may respectively provide the signals SW1 and SW2. The outputs of the two switching elements E1 and E2 are linked to the node 50. Furthermore, the node 50 is linked to the signal output OUT of the integrated circuit IC and by a conductor 5 to a testing input of the control unit ST. The control unit ST has a first output, at which the signal MS is available, which is linked to a control input of the switching element E1 and to the second input of the circuit unit SCH, and a second output which is linked to a control input of the switching element E2.

The principle of operation of the circuit is explained in the following. In this connection, a differentiation can be made between two operating modes of the integrated circuit.

In the first operating mode, the resistor W1 is separated by the switch T1 from the signal output OUT. As there is thus no potential available at the signal output OUT of the integrated circuit IC that corresponds to the value predefined by the control unit ST, the integrated circuit is not switched into the test mode. Provided that an input signal ES is available at the input pin IN, a derived signal OS is applied to the control unit ST at the first output of the circuit unit SCH. The control unit ST passes the signal via the testing input on the line 5 unchanged acceptionally amplified on to the node 50, and thus applies the signal OS as an output signal to the output OUT of the integrated circuit IC.

Figure 2:
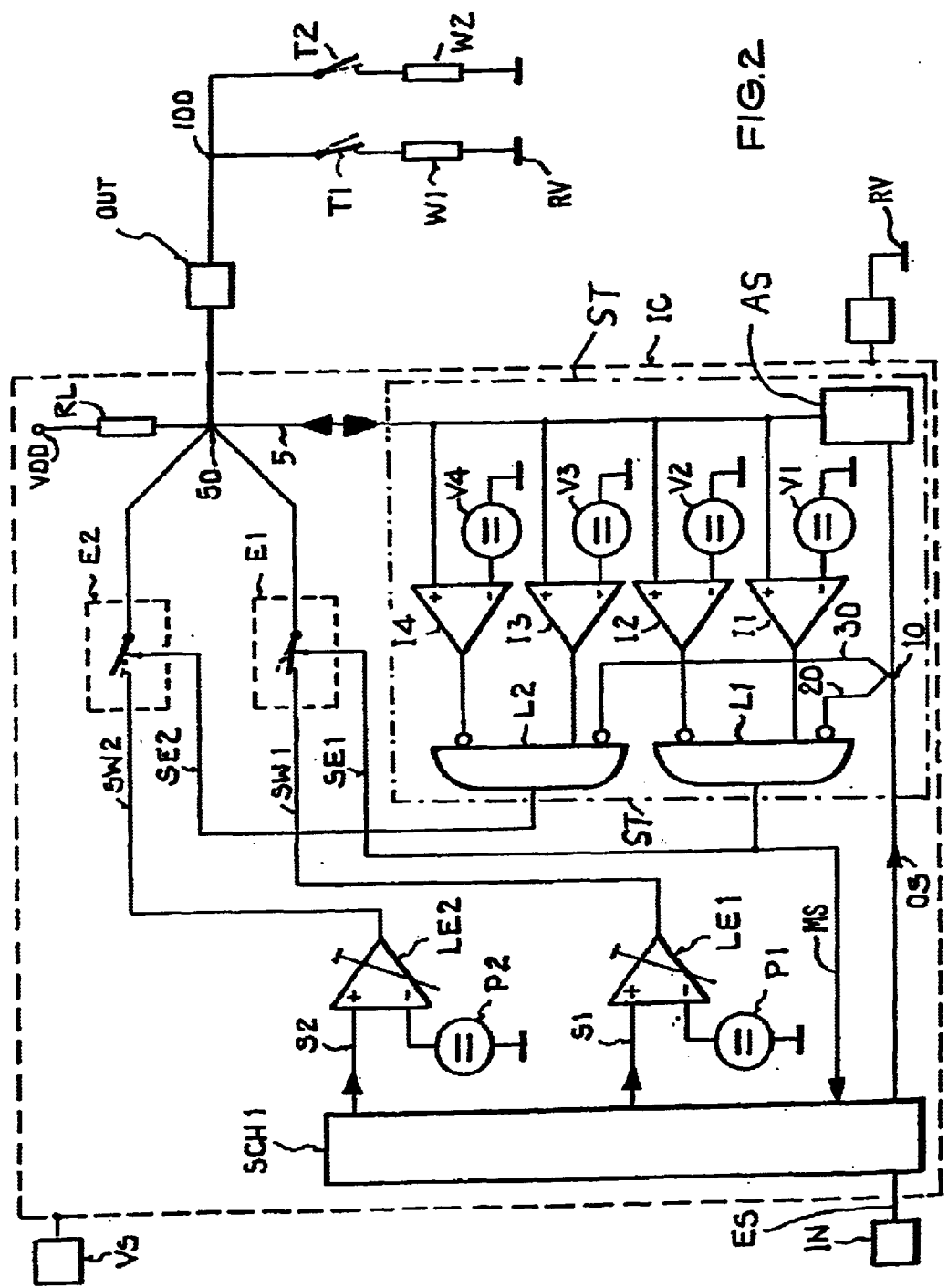

In the second operating mode, a defined potential is set at the output OUT by means of the switch T1 connecting the resistor W1 to the load element RL, as a result of which the integrated circuit IC is switched into a test mode. A circuit arrangement for potential detection is illustrated in FIG. 2. By the switchover into the test mode, a predefined circuit block within the circuit unit SCH, which outputs the signal SW1 to the switching element E1, is selected from the control unit ST by means of the signal MS. Furthermore, the switching element E1 is closed by the signal MS, and the signal SW1 is applied at the signal output OUT as a test signal. The test signal SW1 is an alternating voltage signal in order to minimize the effect on the direct voltage potential at the node 50. If the resistor W1 is separated from the signal output OUT by means of the switch T1, the potential at the node 50 increases to the voltage VDD, and the control unit ST switches the integrated circuit IC back into the normal operating state, that is the signal SW1 is separated from the node 50 by means of the switching element E1, and the selection of the predefined circuit block is cancelled by the signal MS.

The object of the integrated circuit IC shown in FIG. 2 is to supply an alternating voltage signal in normal operation. Whereas the external wiring of the integrated circuit IC is identical with the embodiment illustrated in FIG. 1, an advantageous implementation of a control unit ST is presented in a further development of the embodiment in FIG. 1. In the embodiment illustrated, the switchover of the integrated circuit into the test mode is a function of the result of a logical operation of the set potential value and the control signal of an output stage of the integrated circuit IC. The input IN is linked to a first input of a circuit element SCH1 within the integrated circuit IC. Furthermore, the circuit element SCH1 has a second input at which a signal MS is available, and a first output at which a signal OS is available which is linked to a node 10, and a second output, at which a first signal S1 which is to be tested is available, which is linked to a non-inverting input of a first amplifier LE1, and a third output, at which a second signal S2, which is to be tested is available, which is linked to a non-inverting input of a second amplifier LE2. Furthermore, the input of a signal output stage AS, for example an impedance amplifier, and at any one time a first negative input 20 and 30 of an AND logic gate L1 and L2 are additionally linked to the node 10. The output of the signal output stage AS is linked through the testing input via line 5 to the node 50, to which are linked, apart from the signal output OUT, a load resistor RL downstream of the voltage VDD and in each case the output of a voltage-controlled switching element E1 and a voltage-controlled switching element E2. Furthermore, a first non-inverting input of a comparator I1 and a first non-inverting input of a comparator I2 are linked to the node 50. A lower threshold voltage V1 is available at the inverting input of the comparator I1, which together with the second upper threshold voltage V2 available at the inverting input of the comparator I2 forms a first voltage window discriminator. The output of the comparator I1 is linked to an affirmative input of an AND logic gate L1, and the output of the second comparator I2 is linked to a second negative input of the AND logic gate L1. The output of the logic gate L1, at which a signal SE1 is available, is linked to both the control input of a switching element E1 and to the second input of the circuit unit SCH1. Furthermore, the node 50 is linked to a first non-inverting input of a comparator I3 and to a first non-inverting input of a comparator I4. A lower threshold voltage V3 is available at the inverting input of the comparator I3, which together with the upper threshold voltage V4 available at the inverting input of the comparator I4 forms a second voltage window discriminator. The output of the comparator I3 is linked to an affirmative input of an AND logic gage L2, and the output of the comparator I4 is linked to the second negative input of the AND logic gate L2. The outlet of the logic gate L2, at which a signal SE2 is available, is linked to the control input of a switching element E2. Furthermore, a reference voltage P1 is available at the inverting input of the amplifier LE1. The output of the amplifier LE1, at which the signal SW1 is available, is linked to the node 50 via the voltage-controlled switching element E1. Furthermore, a reference voltage P2 is available at the inverting input of the regulated amplifier LE2. The output of the amplifier LE2, at which the signal SW2 is available, is linked to the node 50 via the voltage-controlled switching element E2.

The principle of operation of the integrated circuit IC depending upon the external wiring is described in the following. There are two different operating modes.

In the first operating mode, which represents the normal operating mode, an input signal ES is available at the signal input IN, from which the circuit unit SCH1 derives the input signal OS for the output amplifier AS. As a signal is available at the node 10 and thus at both of the first inputs of the logic gates L1 and L2, the result of the two AND logic operations is "false". The potential of the node 50 is thus not taken into consideration, that is even a potential value set by the resistor W1 would not switch the integrated circuit into the test mode. As a result, both the voltage-controlled switching elements E1 and E2 remain open. The amplified signal OS is available at the signal output OUT, whereby this represents the output signal of the integrated circuit IC in normal operation.

In the second operating mode, there is no signal OS available at the node 10. The integrated circuit IC is thus switched into a test mode by an external wiring, provided that the potential value set at the node 50 lies within the interval of one of the two window discriminators. In the illustrated embodiment, a potential, which lies within the voltage interval given by the first window discriminator, is set at the node 50 by means of the switch T1 connecting the resistor W1 to the load element RL. As the signals only have the correct polarity at the three inputs of the logic gate L1, only the result of the AND logic operation of the logic gate L1 is "true" and the output signal SE1 is switched to "high". At the same time as the switching element E1 closes, a predefined circuit component in the circuit unit SCH1 is selected by the signal SE1, and a signal shape is generated which is applied in the shape of the signal S1 to the node 50 as signal SW1 by the amplifier LE1. The signal SW1 to be tested is thus available at the signal output OUT. If the switch T1 is opened, the potential at the node 50 increases to above the upper limiting value of the first window discriminator, and the output signal SE1 of the logic gate L1 is switched to "low" because the result of its logic operation is now "false". The selection of the predefined circuit component is terminated and the switching element E1 separates the signal SW1 from the node 50. The node 50 is raised to the value of the voltage VDD by the load element RL (pull up) so long as no further signals are fed to the node 50. If the resistor W2 is linked to the signal output OUT by means of the switch T2, a potential appears at the node 50 which lies within the interval of the second window discriminator. Thus only the result of the logic gate L2 is "true", and the test signal SW2 is applied to the signal output OUT by means of the switching element E2. If the resistor W2 is separated, the logic gate L2 separates the test signal SW2 from the signal output OUT by means of the switching element E2, and the potential of the node 50 is raised to the value of the voltage VDD.

So that the two test signals SW1 and SW2 have minimal effect on the prevailing direct voltage value at the node 50, or a coupling with the prevailing other window discriminator does not occur as a result of signals SW1 and SW2 having an excessive alternating voltage amplitude, the signals S1 and S2 are defined by the amplifiers LE1 and LE2 as regards their maximum amplitude as well as the direct voltage offset. In order to achieve the greatest possible amplitude swing, it is advantageous to select the direct voltage offset of the signals SW1 and SW2 so that this lies in the middle of the interval defined by the respective window discriminator. If the respective switching elements E1 and E2 are open, the test signals are only available at the respective inputs of the switching elements E1 and E2.

In contrast to the logic gate L1, the output of the logic gate L2 is exclusively linked to the control input of the switching element E2. Therefore, a selection, that is an activation or deactivation of circuit functions within the circuit unit SCH1, cannot be made with the signal SE2.

Figure 3:
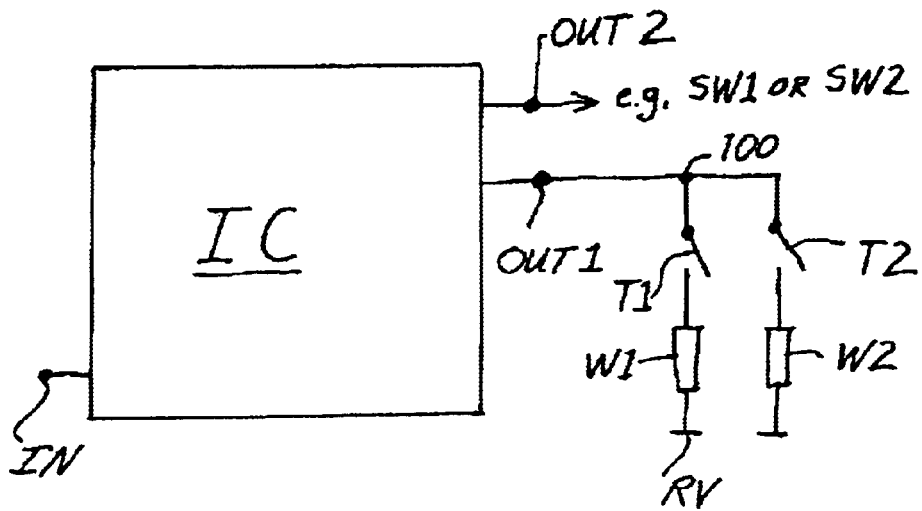
Figure 3:
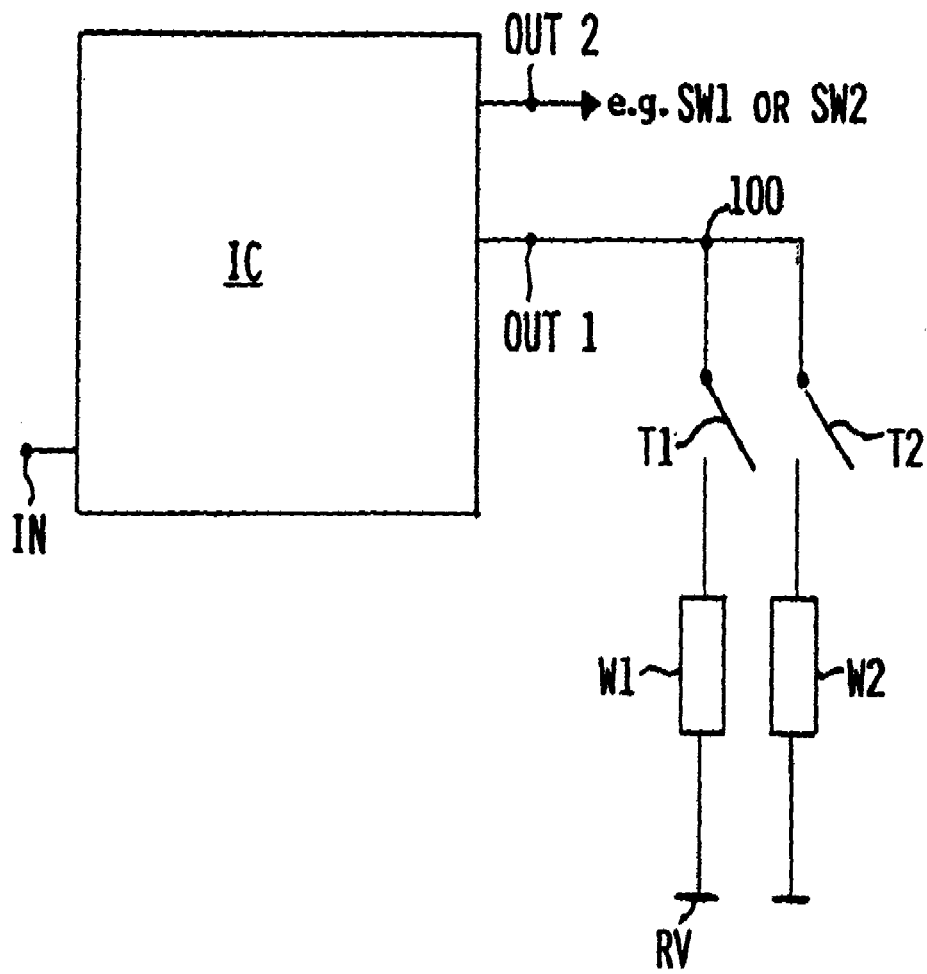

FIG. 3 schematically shows the abovementioned varied embodiment with an integrated circuit IC having plural output pins OUT1, OUT2. While the defined potential value is applied to the first output pin OUT1 by the resistor W1 or W2 as described above, the signal SW1 or SW2 that is to be tested is provided at the second output pin OUT2.

Finally, it should be noted that with the new method the number of test signals is limited only by the amplitude values of the test signals and the distances required between the individual voltage values available at the signal output.

What is claimed is:

1. A method of testing an integrated circuit comprising the steps:
    a) providing at least one output signal generated by a circuit unit of said integrated circuit to at least one signal output pin of said integrated circuit during a normal operating mode;
    b) externally applying an externally applied potential to at least one selected output pin among said at least one signal output pin;
    c) evaluating a potential value of said externally applied potential;
    d) dependent on and responsive to a result of said evaluating, switching from said normal operating mode into a test mode; and
    e) during said test mode, generating in said circuit unit at least one test signal that is to be tested, and providing said at least one test signal to at least one chosen output pin among said at least one signal output pin.

2. The method according to claim 1, wherein said step b) comprises connecting a passive circuit component to said at least one selected output pin and generating said externally applied potential through said passive circuit component.

3. The method according to claim 2, wherein said step b) further comprises connecting said passive circuit component between said at least one selected output pin and a reference potential.

4. The method according to claim 2, wherein said passive circuit component comprises a resistor.

5. The method according to claim 1, wherein said at least one selected output pin in said step b) and said at least one chosen output pin in said step e) both comprise the same output pin among said at least one signal output pin.

6. The method according to claim 1, wherein said at least one signal output pin comprises plural signal output pins including a first output pin and a second output pin that is distinct and separate from said first output pin, said at least one selected output pin in said step b) is said first output pin, and said at least one chosen output pin in said step e) is said second output pin.

7. The method according to claim 1, further comprising varying said externally applied potential so that said potential value of said externally applied potential is initially a first potential value and is then a second potential value different from said first potential value, wherein said at least one test signal generated in said step e) comprises plural test signals including a first test signal and a second test signal different from said first test signal; and further comprising providing said first test signal to said chosen output pin dependent on and responsive to said evaluating in said step c) determining that said externally applied potential has said first potential value, and providing said second test signal to said chosen output pin dependent on and responsive to said evaluating in said step c) determining that said externally applied potential has said second potential value.

8. The method according to claim 7, wherein said circuit unit comprises plural circuit blocks including a first circuit block and a second circuit block, and further comprising activating said first circuit block and deactivating said second circuit block dependent on and responsive to said evaluating in said step c) determining that said externally applied potential has said first potential value, and activating said second circuit block and deactivating said first circuit block dependent on and responsive to said evaluating in said step c) determining that said externally applied potential has said second potential value.

9. The method according to claim 1, wherein said circuit unit comprises plural circuit blocks, and further comprising respectively activating and deactivating different ones of said circuit blocks dependent on and responsive to a result of said evaluating.

10. The method according to claim 1, wherein said steps d) and e) are carried out at a time separate from said steps b) and c), and not overlapping with said steps b) and c).

11. The method according to claim 1, wherein said evaluating in said step c) comprises comparing said potential value to at least one reference value.

12. The method according to claim 1, wherein said evaluating in said step c) comprises comparing said potential value to at least one reference value range defined by an upper reference value and a lower reference value, so as to determine whether said potential value falls in said reference value range.

13. The method according to claim 1, wherein said evaluating in said step c) comprises performing a logical operation on said potential value and a signal value of said at least one output signal generated by said circuit unit.

14. The method according to claim 13, wherein said step d) switches into said test mode only when said signal value is zero and said potential value lies in a prescribed potential value range.

15. The method according to claim 1, wherein said evaluating in said step c) comprises determining whether said potential value lies within a voltage interval of a voltage window discriminator, and said step d) switches into said test mode only when said potential value does lie within said voltage interval of said voltage window discriminator.

16. The method according to claim 15, wherein a signal value of said at least one test signal also lies within said voltage interval of said voltage window discriminator.

* * * * *

UNITED STATES PATENT AND TRADEMARK OFFICE
CERTIFICATE OF CORRECTION

PATENT NO. : 6,937,048 B2
APPLICATION NO. : 10/021746
DATED : August 30, 2005
INVENTOR(S) : Eichin et al.

It is certified that error appears in the above-identified patent and that said Letters Patent is hereby corrected as shown below:

Replace sheet 3 with the attached formal Fig. 3.

Title page,
Item [57], ABSTRACT, delete and replace with the following:
-- An integrated circuit can be tested externally without requiring additional testing output pins or test measuring pads. In the new method, the circuit functions are tested by using the output pins at which the output signal is present during normal operation of the integrated circuit. A defined voltage value is applied to the signal output pin. An integrated control unit evaluates the applied voltage value, and in response thereto switches the integrated circuit into a test mode in which it applies selected signals, which are to be tested, at the signal output pin. --;

Column 3,
Line 34, after "value", replace "Bet" by -- set --;
Line 37, after "window" delete "of the";

Column 4,
Line 24, after "line" delete ",";
Line 53, after "unchanged" replace "acceptionally" by -- or optionally --;

Column 5,
Line 49, after "SE1" insert -- (MS) --.

Signed and Sealed this

Fourth Day of July, 2006

JON W. DUDAS
*Director of the United States Patent and Trademark Office*